United States Patent [19]

Winter et al.

[11] Patent Number: 5,591,483

[45] Date of Patent: Jan. 7, 1997

[54] PROCESS FOR THE PREPARATION OF METAL NITRIDE COATINGS FROM SINGLE SOURCE PRECURSORS

[75] Inventors: Charles H. Winter, Grosse Pointe Park; T. Suren Lewkebandara, Farmington; Kumudini C. Jayaratne, Detroit, all of Mich.

[73] Assignee: Wayne State University, Detroit, Mich.

[21] Appl. No.: 298,764

[22] Filed: Aug. 31, 1994

[51] Int. Cl.$^6$ .................................................. C23C 16/00
[52] U.S. Cl. ................................. 427/248.1; 427/126.1; 427/314
[58] Field of Search ........................ 427/248.1, 314, 427/126.1; 556/51

[56] References Cited

U.S. PATENT DOCUMENTS

| | | |
|---|---|---|
| 5,194,642 | 3/1993 | Winter et al. |
| 5,344,948 | 9/1994 | Verkade ............................ 556/51 |
| 5,409,735 | 4/1995 | Winter et al. ...................... 427/248.1 |

FOREIGN PATENT DOCUMENTS 6-61229  3/1994  Japan.

OTHER PUBLICATIONS

"Preparation of Niobium and Tantalum Organo–imido Complexes from Reactions of the Pentahalides with Amines, etc.", Bates, et al, Polyhedron, vol. 4, No. 8, pp. 1391–1401, 1985.
"Chemical Vapor Deposition of Vanadium, Niobium, and Tantalum Nitride Thin Films", Fix, et al, Chem.Mater., 1993, No. 5, pp. 614–619.
"Low Temperature Deposition of Metal Nitrides by Thermal Decomposition of Organometallic Compounds", Sugiyama, et al, J. Electochem Soc., vol. 122, No. 11, p. 1545 (1975).
"Deposition of Tantalum Nitride Thin Films From Ethylimidotantalum Complex", Chiu and Chang, Journal of Materials Science Letters 11 (1992) pp. 96–98.
"Structure and Electrical Properties of Ta and Ta Nitrides Deposited by Chemical Vapour Deposition", K. Hieber, Thin Solid Films, 24 (1974) pp. 157–164.
"Transition Temperatures and Crystal Structures of Single–Crystal and Polycrystalline NbN$_x$ Films", Oya and Onodera, Journal of Applied Physics, vol. 45, No. 3 Mar., 1974, pp. 1389–1397.
"Chemical Vapor Deposition of Tantalum Nitride Films", Takahashi, et al, Journal of the Less–Common Metals, 52 (1977) pp. 29–36.
"Single–Source Precursors to Niobium Nitride and Tantalum Nitride Films", Winter, et al, Mat.Res.Soc.Symp.Proc., vol. 327 (1994) pp. 103–108.
"Single–Source Precursors to Vanadium Nitride Thin Films", Winter, et al, Mat.Res.Soc.Symp.Proc., vol. 327 (1994) pp. 109–113.
"[TiCl$_4$(NH$_3$)$_2$]: An Improved Single–Source Precursor to Titanium Nitride Films", Winter, et al, Inorganic Chemistry, vol. 33, No. 6, 1994 pp. 1227–1229.

Primary Examiner—Roy V. King
Attorney, Agent, or Firm—Brooks & Kushman P.C.

[57] ABSTRACT

Metal nitride coatings are deposited effectively by the decomposition of single source metal imido-amidoamine precursors perpared by the reaction of a pentavalent metal halide with a primary amine or hydrazine. With hydrazine-derived precursors, TaN coatings may be deposited at temperatures as low as 400 degrees Celcius or lower.

24 Claims, 1 Drawing Sheet

PROCESS FOR THE PREPARATION OF METAL NITRIDE COATINGS FROM SINGLE SOURCE PRECURSORS

This invention was made with Government support, under Contract No. CHE 91 23339, awarded by the National Science Foundation. The Government has certain rights in the invention.

TECHNICAL FIELD

The present invention pertains to a process for the preparation of metal nitride coatings. More particularly, the invention pertains to the preparation of such coatings by a chemical vapor deposition (CVD) process employing a single source metal nitride precursor.

BACKGROUND ART

Metal nitride coatings are known to have a number of chemical and physical properties which make their use desirable in myriad technical applications. Such nitrides are generally hard, refractory materials and may be useful, for example, in such diverse applications as wear-resistant coatings for cutting tools, superconductive films, diffusion barriers and gates in integrated circuits, and in solar control panels.

Metal nitride films may be prepared in several ways. For example, a metal target located near the substrate to be coated may be subjected to plasma containing nitrogen. The corresponding metal nitride is then deposited onto the substrate. This method suffers from the drawbacks of slow and uneven deposition, more particularly a problem when large substrates are to be coated. Like other "line of sight" deposition methods, this method exhibits poor conformal coverage on substrates with high three dimensional character. This poor conformal coverage is particularly a problem in the electronics industry where integrated circuits, for example, have numerous peaks and valleys which require uniform coverage. Moreover, some substrates are sensitive to the high energy environment and thus cannot be coated in this way. Finally, such techniques require the use of relatively high vacuum apparatus, a concern of special importance with physically large substrates.

Laser ablation techniques may also be used. In this case, a target of metal nitride is a ablated in vacuuo by a laser beam, the ablated metal nitride then forming a coating on the substrate. Unfortunately, the ablation process results in generation of clusters of metal nitride particles containing from 2 to 100 metal nitride units. Smooth, highly crystalline coatings are difficult to prepare with this method. Like other "line of sight" physical deposition methods, laser ablation suffers from the drawback of poor conformal coverage.

Chemical vapor deposition (CVD) processes generally exhibit excellent conformal coverage, and have been used to prepare metal nitride coatings. For example, the CVD reaction of niobium pentachloride with ammonia and hydrogen at 950°–1000° C. affords NbN coatings, as reported by G. I. Oya and Y. Onodera, *J. APPL. PHYS.*, 45, 1389 (1974). The high temperatures used in this process precludes use in many applications, for example in integrated circuit coatings.

Treatment of $Nb(NR_2)_5$ with ammonia at 200°–450° C. at atmospheric pressure has provided NbN coatings according to R. Fix et al., *CHEM. MATER.*, 5 614 (1993). However, this method, like that of Oya, requires two reactants, a variation in the relative concentrations of which can affect the stoichiometry of the coating. Fix et al. also disclose preparation of $Ta_3N_5$ coatings. Such coatings have also been prepared by the gas-phase ammonolysis of tantalum pentachloride at 600°–1000° C. as reported by K. Hieber, *THIN SOLID FILMS*, 24, 157 (1974). The foregoing methods, however, are not suitable for the preparation of the often preferred TaN coatings, which may be achieved through the CVD reaction of tantalum pentachloride, nitrogen, and hydrogen in the temperature range of 700°–1000° C., as reported by T. Takahashi et al., *J. LESS COMMON MET.*, 52, 29 (1977). Once again, the high temperatures involved, as well as the necessity for three reactant streams, render such processes problematic.

It would be most desirable to be able to obtain metal nitride coatings from but a single precursor by CVD. The use of a single precursor obviates the need for separate reactant streams, and the accompanying necessity to carefully monitor the concentrations of these streams. H. T. Chiu et al., in *J. MAT. Sci. LETT.*, 11, 96 (1992), reported that the complex $[(Et_2N)_3Ta(\eta^2\text{-}EtN=CMeH)]$ serves as a single source precursor to TaN coatings between 500°–650° C. K. Sugiyama et al., *J. ELECTROCHEM. SOC.*, 122, 1545 (1975) has described deposition of tantalum nitride coatings of unspecified composition from the single source precursor $[Ta(NEt_2)_5]$. There have been no known reports of single source precursors to niobium nitride coatings.

U.S. Pat. No. 5,194,642 discloses formation of coatings from single source precursors of the formula $[TiCl_2(NR)(NH_2R)_2]_3$. However, it is desirable to identify other single source precursors for metal nitride coatings, and particularly, to provide precursors which are able to prepare tantalum nitride coatings having TaN stoichiometry. It is more particularly desirable to identify precursors which may be used to prepare such coatings at low temperatures so as to have widespread applicability as well as economy in application.

DISCLOSURE OF INVENTION

An object of the present invention is to provide suitable single source precursor compounds which are effective in preparing well characterized metal nitride coatings, thus avoiding the use of separate reactant streams.

It is a further object of the present invention to provide single source precursors which are suitable for forming such coatings at the lowest temperatures possible.

It is a still further object of the present invention to provide a process for the formation of metal nitride coatings on a substrate at reduced temperatures and at modest pressure by employing the single source precursors in a chemical vapor deposition process.

These and other objects have been achieved through a process for the preparation of metal nitride coatings by the chemical vapor deposition method employing as a single source precursor, a metal halide/amine complex prepared by reacting a pentavalent metal halide with a substituted amine or hydrazine, or a tetravalent metal halide with a substituted or unsubstituted hydrazine. Preferably the compounds derived from a pentavalent metal M have the formula:

$$[MCl_2(NR)(NHR)(NH_2R)]_n \qquad (I)$$

where R is alkyl, cycloalkyl, aryl, alkenyl, cycloalkenyl, or $NR^1R^2$, where $R^1$ and $R^2$ are independently alkyl, cycloalkyl, alkenyl, cycloalkenyl, aryl, or hydrogen, or together form a cyclic heterocycle with the nitrogen to which they are attached, and where n is a whole number from 1 to 3, while the compounds derived from a tetravalent metal M' have the formula:

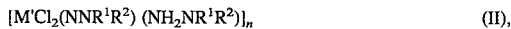
$$[M'Cl_2(NNR^1R^2)(NH_2NR^1R^2)]_n \qquad (II),$$

where $R^1$ and $R^2$ have the same meanings as above, or together with the nitrogen to which they are bonded form a cyclic imine, and where n is preferably 2.

BEST MODE FOR CARRYING OUT THE INVENTION

Figure 1:
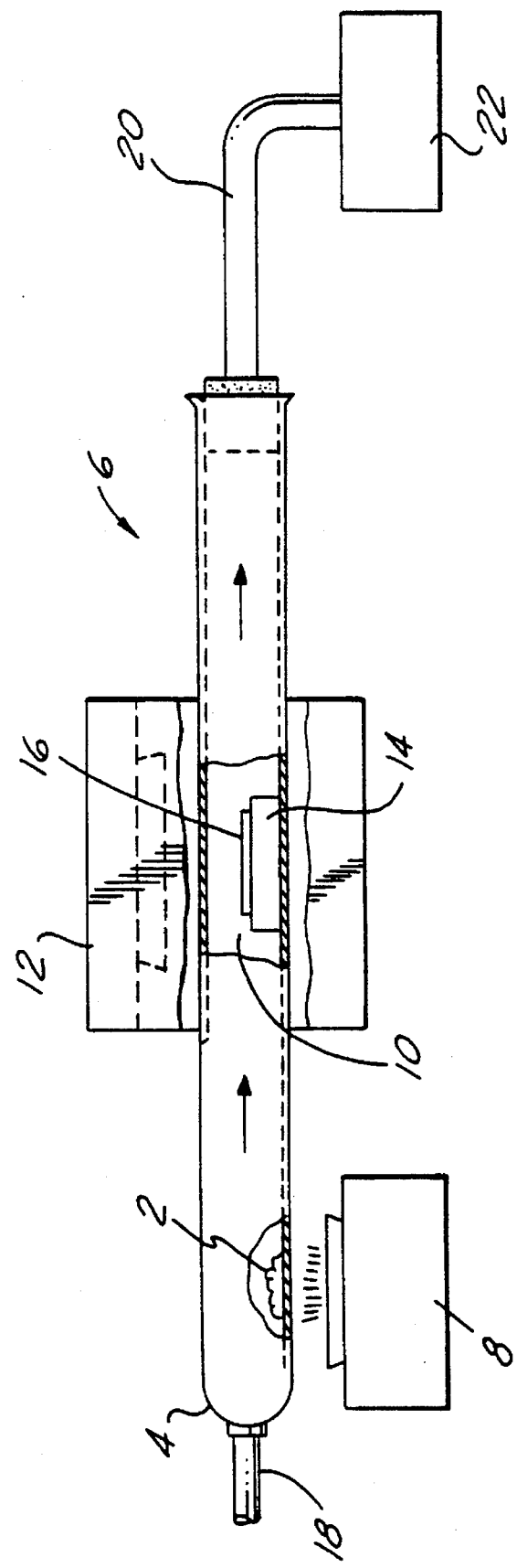
FIG. 1 indicates a suitable apparatus for the deposition of metal nitride coatings according to the process of the invention.

The single source precursors of the present invention are metal halide/amine complexes prepared by reacting a pentavalent metal halide with a substituted amine or hydrazine, or a tetravalent metal halide with a substituted or unsubstituted hydrazine. Preferably the compounds derived from a pentavalent metal M have the formula:

$$[MCl_2(NR)(NHR)(NH_2R)]_n \qquad (I)$$

where R is alkyl, cycloalkyl, aryl, alkenyl, cycloalkenyl, or $NR^1R^2$, where $R^1$ and $R^2$ are independently alkyl, cycloalkyl, alkenyl, cycloalkenyl, aryl, or hydrogen, and where n is a whole number from 1 to 3, while the compounds derived from a tetravalent metal M' have the formula:

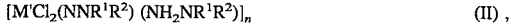
$$[M'Cl_2(NNR^1R^2)(NH_2NR^1R^2)]_n \qquad (II),$$

where $R^1$ and $R^2$ have the same meanings as above, or together with the nitrogen to which they are bonded form a cyclic imine, and wherein n is a whole number from 1 to 3, preferably 2. The formula of the tetravalent metal compounds where $R^1$ and $R^2$ together with nitrogen form a piperidine ring and n is 2 is consistent with spectrographic data obtained from the crystal structure of the compound.

The single source precursor I where R is alkyl, aryl, or alkenyl, may in general be prepared by known methods, for example that disclosed by Nielsen in *POLYHEDRON*, 4, 1391 (1985), wherein $MCl_5$ is reacted with a primary amine of the formula $RNH_2$. R is preferably an alkyl group containing from 1 to 18 carbon atoms, more preferably, a lower alkyl group containing 1 to 4 carbon atoms, and most preferably, t-butylamine. In addition to the preferred alkyl amines, $C_{3-8}$ alkenyl amines, $C_{2-18}$ alkenyl amines, preferably $C_{2-4}$ alkenyl amines, $C_{3-8}$ cycloalkenyl amines, and $C_{6-10}$ aryl amines, preferably $C_6$ aryl amines, may be utilized. The alkyl, alkenyl, and aryl amines may be substituted or unsubstituted in the respective alkyl, alkenyl and aryl moieties, and the alkyl and alkenyl amines may be branched, unbranched, or cyclic.

Suitable alkyl groups are, for example, methyl, ethyl, 1-propyl, 2-propyl, 1-butyl, 2-butyl, t-butyl, 1-pentyl, 2-pentyl, 3-pentyl, 1-hexyl, 2-hexyl, 3-hexyl, 1-heptyl, 2-heptyl, 1-octyl, 2-ethylhexyl, and the like. Suitable cycloalkyl groups are cyclopropyl, cyclobutyl, methylcyclobutyl, dimethylcyclobutyl, cyclopentyl, methylcyclopentyl, dimethylcyclopentyl, cyclohexyl, methylcyclohexyl, ethylcyclohexyl, cycloheptyl, cyclooctyl, norbornyl, methylnorbornyl, benzyl, and the like. Suitable alkenes are, for example, ethenyl, propenyl, methylpropenyl, butenyl, and hexenyl. Suitable cycloalkenes are, for example, cyclopropenyl, cyclobutenyl, cyclopentenyl, cyclohexenyl, methylcyclohexenyl, cyclooctenyl, cyclopentadienyl, cycloheptenyl, cycloheptadienyl, cyclooctadienyl, norbornenyl, and the like. Suitable aryl groups are, for example, phenyl, naphthyl, substituted phenyls such as biphenyl, methylphenyl, ethylphenyl, chlorophenyl, dichlorophenyl, perfluorophenyl, trifluoromethylphenyl, chloronaphthyl, ar-styryl, and the like.

The terms alkyl amine, alkenyl amine, their cyclic analogs, and aryl amines include both substituted and unsubstituted amines. Suitable substituents are those which do not interfere with complex formation during reaction of the respective amine with the metal halide in the preparation of the single source precursors or deposition of nitride coatings. Oxygen-containing substituents should generally be avoided unless bound oxygen can be tolerated in the coating deposited. Suitable substituents will readily suggest themselves to those skilled in the art. Non-limiting examples are lower alkyl, cycloalkyl, phenyl, naphthyl, benzyl, halo, particularly fluoro and chloro, and trifluoromethyl. The complex $[MCl_2(NtBu)(NHtBu)(NH_2tBu)]_2$ is a known compound.

Reaction of $MX_5$ with an appropriately substituted hydrazine affords the hydrazido complexes $[MX_2(NNR^1R^2)(NHNR^1R^2)(NH_2NR^1R^2)]_n$. These compounds have not been previously reported in the literature. Most surprisingly, the hydrazido compounds are effective as single source precursors for NbN and TaN coatings at temperatures much lower than those previously utilized to form coatings from other single source precursors, for example as low as 400° C. It is especially surprising that the tantalum hydrazido complexes form TaN coatings, while the corresponding imido-amido-amine complexes afford only $Ta_3N_5$ coatings except at very high temperatures, for example 1000° C.

Reaction of $M'X_4$ with an appropriately substituted hydrazine affords the hydrazido complexes of the formula $[M'X_2(NNR^1R^2)(NH_2NR^1R^2)]_n$. Like the pentavalent metal hydrazido complexes described above, the tetravalent metal hydrazido complexes are efficient single source coating precursors at surprisingly low temperatures. Titanium hydrazido complexes, for example, form TiN coatings at temperatures of 400° C. and lower, while the amine complexes of U.S. Pat. No. 5,194,642 do so only at temperatures of 475° C. or higher.

In the case of the hydrazido complexes, $R^1$ and $R^2$ have the same meaning as R above, except that one or both of $R^1$ and $R^2$ may be hydrogen, and $R^1$ and $R^2$ together may be alkylene or alkenylene, thus forming a $C_{2-8}$ saturated or unsaturated cyclic imine with the nitrogen atom. Preferably, the hydrazido complex is formed from a $C_{1-4}$ unsymmetrical dialkylhydrazine, most preferably unsymmetrical dimethylhydrazine.

The metals, M and M', are metals capable of forming a three and/or five-valent nitride, i.e. a nitride corresponding to the formulae MN or $M_3N_5$. Non-limiting examples of suitable metals are vanadium, zirconium, hafnium, niobium, and tantalum, and when R is $-NR^1R^2$, titanium. Titanium, niobium, and tantalum are preferred. The metals, in the form of their halides, are reacted with the amine which is generally present in stoichiometric excess.

The reaction of the amine or hydrazine with the metal chloride takes place generally at temperatures of from −20° C. to 100° C., more preferably −10° C. to 40° C., and most preferably at 0° C. to 30° C. Many of the complexes are conveniently prepared at room temperature. Typically, when the reaction is begun at low temperatures, the reactants are allowed to warm to room temperature following a brief initial reaction period ranging from several minutes to several hours. The reaction mixture is then stirred at room temperature or a selected higher temperature for a period ranging from several hours to overnight.

The metal chloride (anhydrous) is generally first dissolved in a suitable solvent, preferably an inert, aprotic solvent, in an inert atmosphere, for example with a nitrogen or argon pad. Suitable solvents are, for example, hexane, benzene, dichloromethane, and the like. The amine or hydrazine reactant is added by traditional techniques, for example by sryinge through a rubber septum. Following the reaction, the reaction mixture is filtered and volatiles removed, preferably at reduced pressure. The solid reaction product may be recrystallized, if desired, by traditional techniques, and may be vacuum dried.

To prepare metal nitride coatings by the process of the invention, the single source precursor is slowly sublimed into a CVDreactor held at the appropriate temperature, preferably at a pressure below atmospheric. The sublimation temperatures of the single source precursors may be determined by routine experimentation. For example, the t-butylamine-derived imido-amido-amine complexes may be sublimed without decomposition at temperatures of approximately 120° C. (0.1 mm Hg). In general, the preferred sublimation temperature is a temperature which provides a suitable rate of deposition without extensive decomposition of the single source precursor. Of course, the sublimation temperature may be increased to beyond the temperature at which the single source precursor begins to decompose. However, in such cases, some loss of the relatively expensive precursor due to premature decomposition may be expected. The hydrazido complexes have been found to sublime without decomposition at temperatures in the range of 150° C. to 175° C. (0.1 mm Hg).

The temperature of the substrate to be coated is adjusted to a temperature high enough to cause significant decomposition of the single source precursor into metal nitride. Alternatively, the apparatus itself may be maintained at a suitable temperature in the neighborhood of the substrate while the substrate itself is maintained at a different temperature. Although higher temperatures of the substrate may lead to increased rates of decomposition, this increase in the decomposition rate is offset by a decrease in the deposition rate. Furthermore, excessively high temperatures may not only damage the substrate, but may also cause extensive deposition on the walls of the chamber when a hot-walled reactor is used. Cold-walled reactors may be used to reduce deposition on the walls of the reactor. Thus, for any given type of metal nitride coating, single source precursor, substrate, and apparatus configuration, the operating parameters must be adjusted to achieve the coating rate, thickness, and quality desired. Such adjustments are routinely made by those of ordinary skill in the art.

The rate of coating formation is preferably greater than 10 Å/s, and may advantageously lie in the range of 1 Å/s to 100 Å/s, more preferably 5 Å/s to 50 Å/s, at substrate temperatures in the range of preferably 400° C. to 600° C. In the latter temperature range, rates in the 10–20 Å/s range have been found to produce high quality, smooth, adherent films. However, lower or higher rates are also contemplated.

An example of a suitable apparatus which may be utilized to coat substrates with metal nitride coatings using the single source precursors of the present invention is illustrated in FIG. 1. The single source precursor 2 is located in the closed end 4 of sealed quartz tube 6. Quartz is generally utilized, as glass tubes may have insufficient strength at higher temperatures. In the case of the hydrazido compounds, which are able to be deposited at lower temperatures, glass tubes or tubes of other materials may suffice. Using heat source 8, single source precursor 2 is sublimed. Heat source 8 is suitable to provide a temperature of from 25° to 300° C. at a pressure selected from a range of about 0.001 to 760 mm Hg. Preferably, heat source 8 will supply a temperature of between 50° and 200° C., and most preferably, between 80° and 175° C., at a pressure in the range of preferably from 0.01 to 1.0 mm Hg.

The sublimate from single source 2 travels through tube 6 to the reaction zone 10. The reaction zone 10 is comprised of that section of the tube 6 arrayed within a furnace 12 which has sufficient heat capacity to increase the temperature of reaction zone 10 to a temperature selected from the range of about 200° to about 1000° C. Preferably, the reaction zone will be heated to a temperature selected from a range of about 400° to 700° C., more preferably from 400° to 600° C. When the hydrazido single source precursor is utilized, the preferred temperature is in the range of from 300° C. to 500° C., more preferably about 400° C. Disposed within reaction zone 10 of the quartz tube 6 is a ceramic stage 14 upon which the desired substrate 16 has been placed. In an alternative embodiment, rather than enclose the entire tube 6 in a furnace, the ceramic stage 14 may itself be heated.

Substrate 16 may be comprised of glass, steel, silicon, or any other substrate desired to be coated. Steel may be defined as an iron-containing alloy. Low sodium glass is particularly suitable, as is stainless steel. An example of a suitable glass is Corning® 7059. Preferably, however, the substrate will be of silicon or other semiconductor materials, for example gallium arsenide, and most preferably will be individual sheets of monocrystalline silicon. Suitable silicon may be obtained from numerous sources, for example from Matheson Scientific of Detroit, Mich. Typical substrates are normally in the range of size from 2 centimeters to about 5 centimeters, although much larger substrates are possible, the size dependent only upon the size of the CVD apparatus.

Upon the passing over of sublimed source 2, substrate 16 is coated with a thin coating of metal nitride. If desired, a stream of inert gas such as nitrogen may be introduced at port 18 to assist in the flow of sublimed source 2 through the tube 6. After exiting reaction zone 10, sublimed source 2 exits quartz tube 6 to leave the system through vacuum pump 22, along with any reaction by-products.

The following examples are provided to illustrate the invention, and are not intended to be limiting in any way. It is anticipated that those skilled in the art will understand that other reactor configurations are possible. All degrees are in Celsius and all parts are by weight percent unless etherwise indicated.

EXAMPLES 1–5 COMPLEX PREPARATION AND CHARACTERIZATION

Example 1

Preparation of $[TiCl_2(NNMe_2)(NH_2NMe_2)]_2$. A 200-mL Schlenk flask was charged with N,N-dimethylhydrazine (12.60 mL, 166 mmol), dichloromethane (100 mL), and a stir bar, and was fitted with a rubber septum. The solution was cooled to 0° C. and titanium tetrachloride (3.0 mL, 27.4 mmol) was added via a syringe to afford a red solution. The solution was allowed to reach ambient temperature and was stirred for 6 h. The volatiles were removed under reduced pressure to afford a red solid which was subsequently extracted with dichloromethane (15 mL). The extract was filtered through a 2 cm pad of Celite® diatomaceous earth and the solvent was removed to give the desired material as a spectroscopically pure solid (7.72 g, 95% based on titanium tetrachloride): mp 79°–80° C; IR (Nujol, cm$^{-1}$) 3237 (m), 3127 (m), 2729 (m), 2668 (w), 2613 (w), 2502 (w), 2454 (w), 1597 (m), 1254 (s), 1024 (m), 1088 (s), 1017 (s), 983 (w), 945 (w), 796 (s, broad), 718 (w); $^1$H NMR (CDCl$_3$, 23° C., δ) 3.36 (s, NN(CH$_3$)$_2$), 3.32 (s, NH$_2$N(CH$_3$)$_2$), 2.71 (s, NH$_2$N(CH$_3$)$_2$), 2.65 (s,NH$_2$N(CH$_3$)$_2$); $^{13}$C{$^1$H} NMR (CDCl$_3$, 23° C., ppm) 51.50 (broad s, NN(CH$_3$)$_2$), 49.27 (broad s, NH$_2$N(CH$_3$)$_2$).

Weight percentage composition calculated for [TiCl$_2$(NNMe$_2$)(NH$_2$NMe$_2$)]$_2$: C, 20.27; H, 5.95; N, 23.64. Found: C, 22.10; H, 6.52; N, 19.65.

Example 2

Preparation of [TaCl$_2$(NNMe$_2$) (NHNMe$_2$) (NH$_2$NMe$_2$)]. A 200-mL Schlenk flask was charged with tantalum pentachloride (1.00 g, 2.79 mmol), dichloromethane (30 mL), and a stir bar, and was fitted with a rubber septum. N,N-Dimethylhydrazine (1.29 mL, 17.0 mmol) was added by syrine and the resultant solution was stirred overnight at ambient temperature. The volatiles were removed under reduced pressure and the resultant orange solid was extracted with a minimum amount of dichloromethane. The solution was filtered through a 2 cm pad of Celite® diatomaceous earth to afford a clear, orange solution. The solvent was removed to afford the desired complex as an orange powder (0.82 g, 68% based upon tantalum pentachloride); mp 89° C. (dec); IR (Nujol, cm$^{-1}$) 3212 (m), 3135 (m), 1299 (m), 1248 (m), 1131 (m), 1014 (s), 888 (m), 798 (m); $^1$H NMR (CDCl$_3$, δ, 23° C.) 3.63–3.46 (m, NH, NH$_2$), 3.01 (s, N(CH$_3$)$_2$), 2.79 (s,N(CH$_3$)$_2$), 2.67 (s, N(CH$_3$)$_2$); $^{13}$C{$^1$H} NMR (CDCl$_3$, 23° C., ppm) 47.55 (s, NN(CH$_3$)$_2$), 42.76 (s, NHN (CH$_3$)$_2$), 35.02 (s, NN (CH$_3$)$_2$).

Weight percentage composition calculated for C$_6$H$_{21}$Cl$_2$N$_6$Ta: C, 16.79; H, 4.93; N, 19.58. Found: C, 16.92; H, 5.59; N, 18.40.

Example 3

Preparation of [NbCl$_2$(NNMe$_2$)(NHNMe$_2$)(NH$_2$NMe$_2$)]. In a fashion similar to the preparation of [TaCl$_2$(NNMe$_2$)(NHNMe$_2$)(NH$_2$NMe$_2$)], niobium pentachloride (1.00 g, 3.70 mmol) and N,N-dimethylhydrazine (1.71 mL, 22.6 mmol) were reacted to afford the desired complex as a yellow powder (1.20 g, 95% based on niobium pentachloride): mp 70° C. (dec); IR (Nujol, cm$^{-1}$) 3191 (m), 3112 (m), 1260 (m), 1123 (m), 1095 (m), 1083 (m), 1055 (m), 1015 (s), 793 (s); $^1$H NMR (CDCl$_3$, δ, 23° C.) 3.34 (broad s, NH, NH$_2$), 3.01 (s, N(CH$_3$)$_2$), 2.83 (s, N(CH$_3$)$_2$), 2.71 (s, N(CH$_3$)$_2$); $^{13}$C{$^1$H} NMR (CDCl$_3$, 23° C., ppm) 47.33 (s, NN(CH$_3$)$_2$), 42.77 (s, NHN(CH$_3$)$_2$), 35.13 (s, NN(CH$_3$)$_2$).

Weight percentage composition calculated for C$_6$H$_{21}$Cl$_2$N$_6$Nb: C, 21.13; H, 6.21; N, 24.64. Found: C, 21.31; H, 6.79; N, 20.61.

Example 4

Preparation of [TaCl$_2$(NtBu)(NHtBu)(NH$_2$tBu)]$_2$. A 250-mL Schlenk flask was charged with tantalum pentachloride (5.00 g, 14.0 mmol), benzene (60 mL), and a stir bar, and was fitted with a rubber septum. The solution was cooled to 0° C. and t-butylamine (14.9 mL, 141 mmol) was added to afford a white turbid solution. The solution was allowed to reach ambient temperature and was stirred for 6 h. The volatiles were removed at reduced pressure and the resultant white solid was extracted with a minimum amount of benzene. The suspension was filtered through a 2 cm pad of Celite® diatomaceous earth to give a clear, colorless solution. Volatiles were removed at reduced pressure and the resultant white solid was vacuum dried for 24 h to afford the complex (5.14 g, 79% based on tantalum pentachloride): dec. point 270° C.; IR (Nujol, cm$^{-1}$) 3278 (m), 3240 (w), 3202 (m), 3171 (s), 3096 (m), 1264 (s), 1208 (s), 1164 (m), $^1$H NMR (CDCl$_3$, δ, 23° C.) 4.36–3.96 (m, NH, NH$_2$), 1.40, 1.36, 1.35 (C(CH$_3$)$_3$; $^{13}$C{$^1$H} NMR (CDCl$_3$, 23° C., ppm) 66.50 (s, NC(CH$_3$)$_2$), 57.51 (s, NHC(CH$_3$)$_2$), 53.21 (s, NH$_2$C(CH$_3$)$_2$), 33.24 (s, NC(CH$_3$)$_2$), 32.37 (s, NHC(CH$_3$)$_2$), 30.51 (s, NH$_2$C(CH$_3$)$_2$).

Weight percentage composition calculated for C$_{12}$H$_{30}$Cl$_2$N$_3$Ta: C, 30.78; H, 6.49; N, 8.93. Found: C, 30.47; H, 6.49; N, 8.93.

Example 5

Preparation of [NbCl$_2$(NtBu)(NHtBu)(NH$_2$tBu)]$_2$. In a fashion similar to the preparation of [TaCl$_2$(NtBu)(NHtBu)(NH$_2$tBu)]$_2$, niobium pentachloride (2.50 g, 9.25 mmol), and t-butylamine (7.80 mL, 74.0 mmol) were reacted to afford the desired complex as a bright yellow powder (2.80 g, 79% based upon niobium pentachloride): dec. point 220° C.; IR (Nujol, cm$^{-1}$) 3291 (m), 3235 (m), 3178 (s), 3100 (s), 1567 (m), 1279 (m), 1234 (s), 1212 (s), 1155 (m), 1133 (m), 812 (m), 789 (m), 772 (m), 734 (m); $^1$H NMR (CDCl$_3$, δ, 23° C.) 4.28–3.83 (m, NH, NH$_2$), 1.31 (s, 2 C(CH$_3$)$_3$), 1.27 (s, C(CH$_3$)$_3$); $^{13}$C{$^1$H} NMR (CDC$_3$, 23° C., ppm) 69.56 (s, NC(CH$_3$)$_2$), 59.41 (s, NHC (CH$_3$)$_2$), 52.25 (s, NH$_2$C(CH$_3$)$_2$), 32.31 (s, NC(CH$_3$)$_2$), 30.76 (s, NHC(CH$_3$)$_2$), 30.50 (s, NH$_2$C(CH$_3$)$_2$).

Weight percentage composition calculated for C$_{12}$H$_{30}$Cl$_2$N$_3$Nb: C, 37.91; H, 7.95; N, 11.05. Found: C, 37.60; H, 7.80; N, 10.96.

Coating PREPARATION AND CHARACTERIZATION

Example 6

The dimethylhydrazido titanium dichloride complex of Example 1 was placed into the apparatus of FIG. 1 and slowly sublimed at a temperature of 125° C. to 150° C. The substrates to be coated were maintained at 400° C., 500° C., and 600° C., respectively. Smooth, adherent, gold-colored coatings of TiN were deposited on the substrates in each case. Films produced on glass substrates employing c.a. 5.0 mmol of the single source precursor using a 2 minute deposition time afforded film thicknesses of 2000Å at 500° C. and 1350Å at 600° C., which correspond to growth rates of 120 Å/min and 660 Å/min respectively. X-ray diffraction patterns of the coatings deposited on glass revealed cubic titanium nitride with a preferential orientation along the [200] crystallographic phase. X-ray photoelectron spectroscopy of films made at 400° C., 500° C., and 600° C. disclosed undetectable (≦2%) carbon or chlorine contamination.

Example 7

The dimethylhydrazido tantalum dichloride complex of Example 2 was placed in the apparatus if FIG. 1 and slowly sublimed at a temperature of from 150°–175° C. at 0.1 mm Hg. The CVD reactor was maintained at temperatures of 400° C., 500° C., and 600° C., and in each case resulted in deposition of smooth, adherent (Scotch® tape test), silver colored coatings of TaN. The X-ray diffraction pattern of a coating prepared at 600° C. on Corning® 7059 glass was consistent with cubic tantalum nitride with a preferred orientation. The X-ray photoelectron spectrum of a coating deposited at 500° C. on 7059 glass was consistent with a 1:1.1 tantalum/nitrogen ratio with c.a. 6 weight percent oxygen in the coating relative to tantalum. The X-ray photoelectron spectrum of coatings prepared at 400° C. and 600° C. gave similar stoichiometries. The formation of TaN coatings from the hydrazido complex was most surprising since the corresponding imido-amido-amine complex prepared from t-butylamine yielded $Ta_3N_5$ coatings under the same conditions.

Scanning electron microscopy of coatings deposited on glass at 600° C. revealed a smooth surface with particle sizes in the range of 50–200Å. Deposition rate at 600° C. was 17 Å/s. Resistivity of a 2000Å coating deposited at 600° C. was 2.1 microhm-cm. The visible-infrared spectrum showed a steady increase in reflectivity from about 12% at 400 nm to about 45% at 2000 nm. The transmission spectrum showed 0 absorbance from 400–1000 nm and 2–7% between 1200–2000 nm.

Example 8

Slow sublimation of the dimethylhydrazido niobium dichloride comples of Example 3 at 125°–150° C. onto glass and silicon substrates at 400° C., 500° C., and 600° C. resulted in the deposition of smooth, highly adherent (Scotch® tape test), silver colored coatings of NbN. X-ray diffraction spectra showed reflection patterns characteristic of cubic NbN. The X-ray photoelectron spectrum of a coating deposited on Corning® 7059 glass at 500° C. divulged a stoichiometry of $Nb_{1.0}N_{0.3}$ with c.a. 30 weight percent oxygen in the coating relative to niobium. It appears likely that nitrogen is preferentially sputtered from the coating during XPS analysis, and thus the stoichiometry is believed to be NbN, consistent with the X-.ray diffraction pattern. Such selective sputtering has been reported in the literature by Palacio, et. al., *THIN SOLID FILMS*, 124, 243 (1985). The visible-infrared spectrum was nearly identical to that of the NbN coating prepared in Example 9, supra.

Example 9

Slow sublimation of the t-butylamine-derived imido-amido-amine tantalum dichloride complex of Example 4 at 120° C. onto a substrate in a CVD reactor maintained at 500° C. or 600° C. resulted in deposition of yellow-brown coatings of $Ta_3N_5$, determined by X-ray diffraction.

Example 10

Slow sublimation of the t-butylamine-derived imido-amido-amine niobium dichloride complex of Example 5 at 120° C. onto glass and silicon substrates at 500° C. and 600° C. resulted in deposition of smooth, highly adherent, silver-colored coatings of NbN. The X-ray diffraction spectrum was consistent with NbN. The X-ray photoelectron spectrum of a coating prepared at 500° C. on glass revealed a stoichiometry of Nb/N of approximately 2:1, with about 10% C and 6% O based on niobium. However, the X-ray diffraction pattern was only consistent with NbN, and thus it is believed that preferential sputtering of N is occuring during XPS analysis.

Scanning electron microscopy of a coating prepared on glass at 500° C. revealed a smooth surface with particle sizes in the range of 50–200Å. The deposition rate at 500° C. was 13 Å/s. The resistivity of a 1200Å thick coating prepared at 500° C. was 980 microhm-cm. The visible-infrared reflectivity increased from 20–54% reflectance between 400–800 nm to a relatively uniform 54–65% reflectance between 800–2000 nm. The transmission spectrum showed uniform 0–4% absorbance between 400–2000 nm.

We claim:

1. A process for coating a substrate with a coating of metal nitride by chemical vapor deposition from a single source precursor, comprising:

a) selecting as said precursor
  i) the reaction product of a primary amine of the formula $NH_2$—R with a metal halide of the formula $MX_5$ where X is fluorine, chlorine, bromine, or iodine, or
  ii) the reaction product of a primary amine of the formula $NH_2$—$NR^1R^2$ with a metal halide of the formula $MX_4$ where X is fluorine, chlorine, bromine, or iodine;

where M is a metal;

where R is selected from the group consisting of $C_{1-8}$ alkyl, $C_{3-8}$ cycloalkyl, $C_{2-18}$ alkenyl, $C_{3-8}$ cycloalkenyl, $C_{6-10}$ aryl radicals, —$NR^1R^2$, and mixtures thereof;

where $R^1$ is selected from the group consisting of hydrogen, $C_{1-18}$ alkyl, $C_{3-8}$ cycloalkyl, $C_{2-8}$ alkenyl, $C_{3-8}$ cycloalkenyl, and $C_{6-10}$ aryl radicals;

where $R^2$ is selected from the group consisting of hydrogen, $C_{1-18}$ alkyl, $C_{3-8}$ cycloalkyl, $C_{2-18}$ alkenyl, $C_{3-8}$ cycloalkenyl, and $C_{6-10}$ aryl radicals; or where $R^1$ and $R^2$ together with N form a cyclic $C_{2-8}$ saturated or $C_{3-8}$ unsaturated imine;

b) subliming said precursor at a pressure of from 0.0001 mm Hg to about 760 mm Hg; and c) contacting said sublimed precursor with a substrate maintained at a temperature sufficient to effect decomposition of said precursor to metal nitride, whereby said coating of metal nitride is formed on said substrate.

2. The process of claim 1 wherein said primary amine is a $C_{1-4}$ alkyl primary amine.

3. The process of claim 1 wherein X is Cl.

4. The process of claim 1 wherein said substrate is heated to a temperature of about 300° C. to about 1000° C.

5. The process of claim 1 wherein said primary amine has the formula:

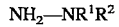

$NH_2$—$NR^1R^2$ where $R^1$ and $R^2$ are $C_{1-4}$ lower alkyl.

6. The process of claim 5 wherein X is Cl.

7. The process of claim 5 wherein said substrate is heated to a temperature of about 400° C. to 500° C.

8. The process of claim 1 wherein said coating is formed at a rate greater than 10 Å/s.

9. The process of claim 8 wherein said substrate is maintained at a temperature of from about 400° C. to about 600° C.

10. A process for coating a substrate with a coating of metal nitride by chemical vapor deposition from a single source precursor, comprising:

a) selecting as said precursor a complex of the formula:

$$[MX_2(NR)(NHR)(NH_2R)]_n$$

where M is Nb or Ta;

where X is fluorine, chlorine, bromine, or iodine;

where R is selected from the group consisting of $C_{1-18}$ alkyl, $C_{3-8}$ cycloalkyl, $C_{2-18}$ alkenyl, $C_{3-8}$ cycloalkenyl, $C_{6-10}$ aryl radicals, $-NR^1R^2$, and mixtures thereof;

where $R^1$ is selected from the group consisting of hydrogen, $C_{1-18}$ alkyl, $C_{3-8}$ cycloalkyl, $C_{2-18}$ alkenyl, $C_{3-8}$ cycloalkenyl, and $C_{6-10}$ aryl radicals;

where $R^2$ is selected from the group consisting of hydrogen, $C_{1-18}$ alkyl, $C_{3-8}$ cycloalkyl, $C_{2-18}$ alkenyl, $C_{3-8}$ cycloalkenyl, and $C_{6-10}$ aryl radicals; or where $R^1$ and $R^2$ together with N form a cyclic $C_{2-8}$ saturated or $C_{3-8}$ unsaturated imine; and where n is a whole number from 1–3;

b) subliming said precursor; and c) contacting said sublimed precursor with a substrate maintained at a temperature sufficient to effect decomposition of said precursor to metal nitride, whereby said coating of metal nitride is formed on said substrate.

11. The process of claim 10 wherein R is $C_{1-4}$ lower alkyl.

12. The process of claim 10 wherein R is t-butyl.

13. The process of claim 10 where R is $$-NR^1R^2$$

wherein $R^1$ and $R^2$ are $C_{1-4}$ lower alkyl.

14. The process of claim 13 wherein said substrate is heated to a temperature of 300° C. to about 600° C.

15. The process of claim 13 wherein said substrate is heated to a temperature of about 400° C.

16. The process of claim 13 wherein said complex is $[MCl_2(NNMe_2)(NHNMe_2)(NH_2NMe_2)]$.

17. The process of claim 10 wherein said coating is formed at a rate greater than 10 Å/s.

18. The process of claim 17 wherein said substrate is maintained at a temperature of from about 400° C. to about 600° C.

19. A process for coating a substrate with a coating of metal nitride by chemical vapor deposition from a single source precursor, comprising:

a) selecting as said precursor a complex of the formula:

$$[M'X_2(NNR^1R^2)(NH_2NR^1R^2)]_n$$

where M' is a metal;

where X is fluorine, chlorine, bromine, or iodine;

where $R^1$ is selected from the group consisting of hydrogen, $C_{1-18}$ alkyl, $C_{3-8}$ cycloalkyl, $C_{2-18}$ alkenyl, $C_{3-8}$ cycloalkenyl, and $C_{6-10}$ aryl radicals, where $R^2$ is selected from the group consisting of hydrogen, $C_{1-18}$ alkyl, $C_{3-8}$ cycloalkyl, $C_{2-18}$ alkenyl, $C_{3-8}$ cycloalkenyl, and $C_{6-10}$ aryl radicals; or where $R^1$ and $R^2$ together with N form a cyclic $C_{2-8}$ saturated or $C_{3-8}$ unsaturated imine; and where n is a whole number from 1–3;

b) subliming said precursor; and c) contacting said sublimed precursor with a substrate maintained at a temperature sufficient to effect decomposition of said precursor to metal nitride, whereby said coating of metal nitride is formed on said substrate.

20. The process of claim 19 wherein M is selected from the group consisting of Ti, Zr, and Hf.

21. The process of claim 19 wherein said coating is formed at a rate greater than 10 Å/s.

22. The process of claim 21 wherein said substrate is maintained at a temperature of from about 400° C. to about 600° C.

23. The process of claim 21 wherein said substrate is maintained at a temperature of about 400° C.

24. A process for coating a substrate with a coating of tantalum nitride by chemical vapor deposition from a single source precursor, comprising:

a) selecting as said precursor i) the reaction product of a primary amine of the formula $NH_2-R$ with a tantalum halide of the formula $MX_5$ where X is fluorine, chlorine, bromine, or iodine, or ii) the reaction product of a primary amine of the formula $NH_2-NR^1R^2$ with a tantalum halide of the formula $MX_4$ where X is fluorine, chlorine, bromine, or iodine;

where R is selected from the group consisting of $C_{1-18}$ alkyl, $C_{3-8}$ cycloalkyl, $C_{2-18}$ alkenyl, $C_{3-8}$ cycloalkenyl, $C_{6-10}$ aryl radicals, $-NR^1R^2$, and mixtures thereof;

where $R^1$ is selected from the group consisting of hydrogen, $C_{1-18}$ alkyl, $C_{3-8}$ cycloalkyl, $C_{2-18}$ alkenyl, $C_{3-8}$ cycloalkenyl, and $C_{6-10}$ aryl radicals;

where $R^2$ is selected from the group consisting of hydrogen, $C_{1-18}$ alkyl, $C_{3-8}$ cycloalkyl, $C_{2-18}$ alkenyl, $C_{3-8}$ cycloalkenyl, and $C_{6-10}$ aryl radicals; or where $R^1$ and $R^2$ together with N form a cyclic $C_{2-8}$ saturated or $C_{3-8}$ unsaturated imine;

b) subliming said precursor at a pressure of from 0.0001 mm Hg to about 760 mm Hg; and c) contacting said sublimed precursor with a substrate maintained at a temperature sufficient to effect decomposition of said precursor to tantalum nitride, whereby said coating of tantalum nitride is formed on said substrate.

\* \* \* \* \*